(12) United States Patent
Peng et al.

(10) Patent No.: US 8,120,008 B2
(45) Date of Patent: Feb. 21, 2012

(54) CARBON-NANOTUBE BASED OPTO-ELECTRIC DEVICE

(75) Inventors: Lianmao Peng, Beijing (CN); Xuelei Liang, Beijing (CN); Zhiyong Zhang, Beijing (CN); Sheng Wang, Beijing (CN); Qing Chen, Beijing (CN)

(73) Assignee: Peking University, Beijing (CN)

( * ) Notice: Subject to any disclaimer, the term of this patent is extended or adjusted under 35 U.S.C. 154(b) by 399 days.

(21) Appl. No.: 12/422,074

(22) Filed: Apr. 10, 2009

(65) Prior Publication Data

US 2009/0267053 A1  Oct. 29, 2009

(51) Int. Cl.
*H01L 29/06* (2006.01)
(52) U.S. Cl. ............... 257/10; 257/13; 257/15; 427/77
(58) Field of Classification Search ............. 977/742, 977/902; 257/10, 13, 15; 427/77
See application file for complete search history.

(56) References Cited

U.S. PATENT DOCUMENTS

2005/0062195 A1   3/2005   Chao
2009/0051267 A1   2/2009   Kato

*Primary Examiner* — Samuel Gebremariam
(74) *Attorney, Agent, or Firm* — SV Patent Service

(57) ABSTRACT

A carbon nano-tube based photoelectric device includes a substrate and a carbon nanotube (CNT) over the substrate. The CNT comprises a first end and a second end, wherein the CNT has a CNT work function. A high work-function electrode over the substrate is in electric contact with the first end of the CNT. The high work-function electrode has a first work function higher than the CNT work function. A low work-function electrode over the substrate is in electric contact with the second end of the CNT. The low work-function electrode has a second work function lower than the CNT work function. The CNT can form a conductive channel between the high work-function electrode and the low work-function electrode. The carbon nano-tube based photoelectric device also includes a dielectric material is in contact with a side surface of the CNT and a conductive material in contact with the dielectric material.

12 Claims, 10 Drawing Sheets

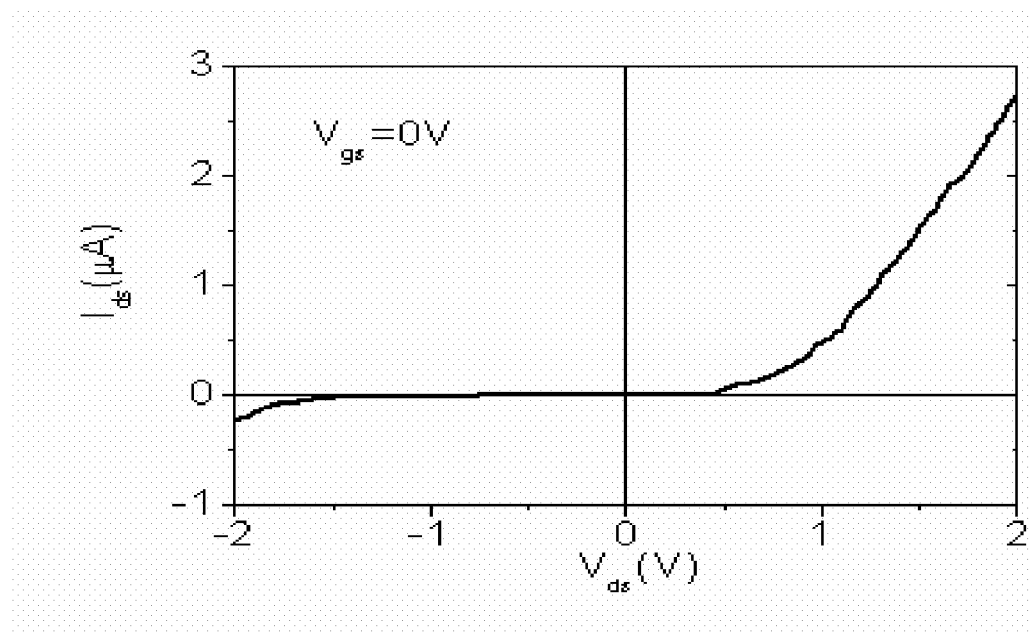
Fig. 3
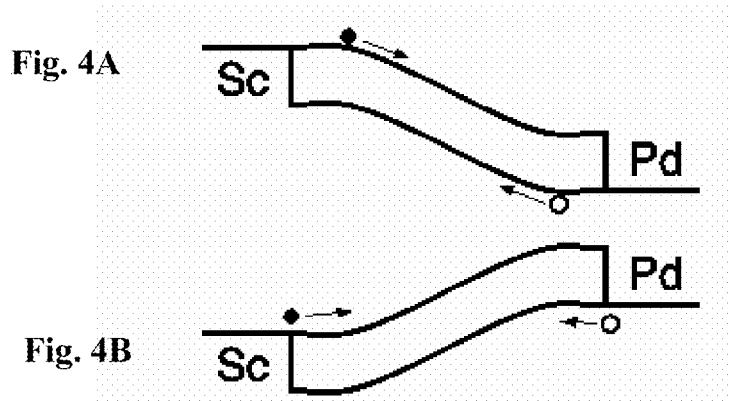
Fig. 4A
Fig. 4B
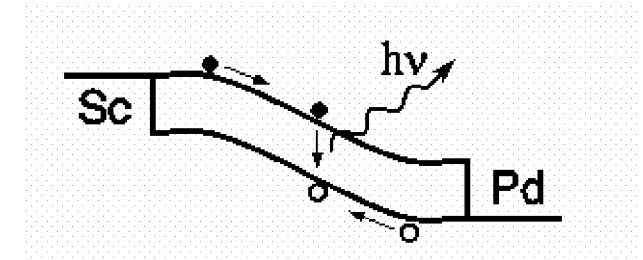
Fig. 5

Carbon nanotube     Sc     Pd     Ti/HfO$_2$

CARBON-NANOTUBE BASED OPTO-ELECTRIC DEVICE

RELATED APPLICATIONS

The present application claims priority to commonly assigned pending Chinese Patent Application 200810105174.9, entitled "A carbon-nanotube based photo-electric device, optoelectric integration unit and photoelectric integrated circuit" by the same inventors, filed Apr. 29, 2008, the content of which is incorporated herein by reference.

BACKGROUND

The present disclosure relates to nano electronic devices, in particular, to carbon nanotube (CNT) based electronic devices.

After more than 40 years rapid development, silicon-based transistors are reaching their physical limitations. The state of art 45 nm technology has adopted high-K technology and metal gate electrode to replace $SiO_2$ dielectric and high-level doped polysilicon electrode. The most important part in device, silicon channel, is also gradually replaced by stress silicon. Although the development of 32 nm technologies is nearly over, it is unclear how micro-electronics will develop beyond 32 nm technologies. The transistor technology roadmap of Intel Corporation includes CNT and semiconductor nanowires as candidates for integrated circuits after 2011. But details and feasibilities of these potential technologies are still not available.

As a semiconductor material, silicon does not have the most outstanding performance. Germanium, for example, has s electron mobility much higher than silicon's. Another significant drawback for silicon is that silicon is an indirect-gap semiconductor, which severely limits the development of silicon based devices in photoelectric applications and results in separate development of silicon based integrated circuits (IC) and semiconductor photoelectric device. Although several breakthroughs have been achieved on silicon based photo-electric device in recent years, the integration of silicon based photoelectric device and CMOS device are still not possible due to the differences in their physical dimensions.

CNT is different from silicon in nature. The CNT has advantageous electric properties. The energy band is symmetric at the Fermi level such that electrons and holes have the same mobilities. CNT's electron mobility measured in lab is higher than those in silicon, III-V semiconductor materials such as GaAs, and II-IV semiconductor materials. The hole mobility of CNT is measured to be greatly higher than semiconductor materials. For this reason CNT may be a suitable material for CMOS electric devices. Additionally, the CNT also has beneficial photoelectric properties. CNT has direct band gap. The gap is inversely proportional to the diameter of a carbon nanotube. The band gap for CNT with an approximately 1 nm diameter is in the infrared range, which is ideal to be used as a photoelectric material in communication devices.

There is therefore a need for a more compact and higher performance photoelectric device that does not suffer from the drawbacks of the silicon based semiconductors. There is also a need for a photoelectric device that is integrated with an integrated circuit.

SUMMARY

In a general aspect, the present invention relates to a carbon nano-tube based photoelectric device that includes a substrate, a carbon nanotube (CNT) over the substrate, wherein the CNT comprises a first end and a second end, wherein the CNT has a CNT work function, a high work-function electrode over the substrate and in electric contact with the first end of the CNT, wherein the high work-function electrode has a first work function higher than the CNT work function, a low work-function electrode over the substrate and in electric contact with the second end of the CNT, wherein the low work-function electrode has a second work function lower than the CNT work function, wherein the CNT can form a conductive channel between the high work-function electrode and the low work-function electrode, a dielectric material in contact with a side surface of the CNT; and a conductive material in contact with the dielectric material.

In another general aspect, the present invention relates to a carbon nano-tube based photoelectric integrated circuit that includes a substrate; a first high work-function electrode having a first work function and over the substrate; a second high work-function electrode having a second work function and over the substrate; a first low work-function electrode having a third work function and over the substrate; a second low work-function electrode having a fourth work function and over the substrate; a first carbon nanotube (CNT) over the substrate, wherein the first CNT can form a conductive channel between the first high work-function electrode and the second high work-function electrode; a second CNT over the substrate, wherein the second CNT can form a conductive channel between the second high work-function electrode and the first low work-function electrode; a third CNT over the substrate, wherein the third CNT can form a conductive channel between the first low work-function electrode and the second low work-function electrode, wherein the first work function and the second work function are higher than a work function of at least one of the first CNT, the second CNT, or the third CNT, wherein the third work function and the fourth work function are lower than a work function of at least one of the first CNT, the second CNT, or the third CNT; a dielectric material in contact with a side surface of the first CNT, the second CNT or the third CNT; and a conductive material in contact with the dielectric material.

In another general aspect, the present invention relates to a carbon nano-tube based photoelectric integrated circuit that includes a substrate; a circuit comprising a first circuit unit, a second circuit unit, and a third circuit unit, wherein the first circuit unit, the second circuit unit, and the third circuit unit are interconnected, wherein the first circuit unit comprises: a first high work-function electrode having a first work function and over the substrate; a second high work-function electrode having a second work function and over the substrate; a first carbon nanotube (CNT) over the substrate, wherein the first CNT can form a conductive channel between the first high work-function electrode and the second high work-function electrode, wherein each of the first work function and the second work function is higher than a work function of the first CNT; a first dielectric material in contact with a side surface of the first CNT; and a first conductive material in contact with the first dielectric material. The second circuit unit comprises a first low work-function electrode having a third work function and over the substrate; a second low work-function electrode having a fourth work function and over the substrate; a second carbon nanotube (CNT) over the substrate, wherein the second CNT can form a conductive channel between the first low work-function electrode and the second low work-function electrode, wherein each of the third work function and the fourth work function is lower than a work function of the second CNT; a second dielectric material in contact with a side surface of the first CNT; and a second conductive material in contact with the second dielectric material. The third circuit unit include a third high work-function electrode having a fifth work function and over the substrate; a third low work-function electrode having a sixth work function and over the substrate; a third carbon nanotube (CNT) over the substrate, wherein the third CNT can form a conductive channel between the third high work-function electrode and the third low work-function electrode, wherein the fifth work function is higher than a work function of the third CNT, wherein the sixth work function is lower than the work function of the third CNT; a third dielectric material in contact with a side surface of the third CNT; and a third conductive material in contact with the third dielectric material.

Implementations of the system may include one or more of the following. The CNT can be substantially parallel to a surface of the substrate. The substrate can include the conductive material, wherein the dielectric material is formed on the substrate. The CNT can be formed on the dielectric material. The dielectric material can be formed on the CNT, wherein the conductive material is formed on the dielectric material. The high work-function electrode can include Palladium. The low work-function electrode can include Scandium or Yttrium.

The disclosed system and methods may include one or more of the following advantages. In one aspect, the present application discloses a photoelectric device that is more compact and has higher performance than conventional photoelectric devices. In another aspect, the present application discloses an integrated nano device that includes photoelectric functions and the functions of an IC. The disclosed integrated nano device is more compact and has more functions than conventional semiconductor based ICs or photoelectric devices.

The present application discloses CNT-based high performance multi-functional photoelectric devices and CNT-based electric or photoelectric nano-circuit units. Large scale device integration and a wide range of device functions can be achieved by connecting electrodes of the CNT-based nano-circuit units, which may achieve higher device density and improved performance than the current state of the art silicon based CMOS technologies.

Although the invention has been particularly shown and described with reference to multiple embodiments, it will be understood by persons skilled in the relevant art that various changes in form and details can be made therein without departing from the spirit and scope of the invention.

BRIEF DESCRIPTION OF THE DRAWINGS

The following drawings, which are incorporated in and form a part of the specification, illustrate embodiments of the present invention and, together with the description, serve to explain the principles of the invention.

FIG. 3 shows another exemplified I-V performance curve for the CNT-based photoelectric device in FIG. 1, exhibiting the characteristics of a barrier-free bipolar diode.

FIGS. 4A and 4B illustrate the operation principle for the CNT-based photoelectric device of FIG. 3.

FIG. 5 illustrates the mechanism for the light emitting function performed by the CNT-based photoelectric device of FIG. 1.

DETAILED DESCRIPTION

Figure 1:
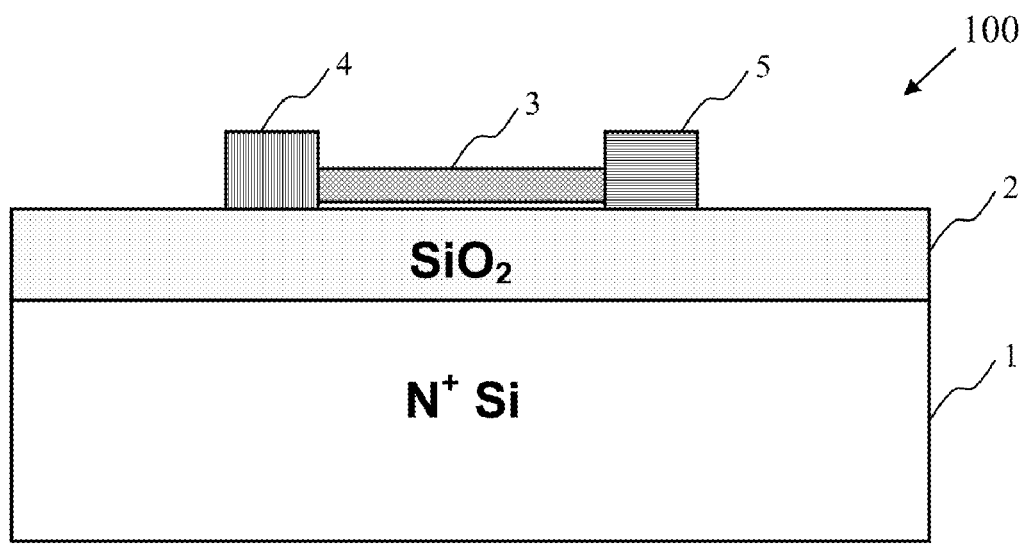
FIG. 1 is a schematic diagram of a back-gate CNT-based photoelectric device.

In one aspect, the present application discloses a CNT based high performance multi-functional photoelectric device. Referring to FIG. 1, a photoelectric device 100 includes a conductive substrate 1 and an insulator layer 2 grown on the conductive substrate 1. A semiconductor CNT 3 is formed or introduced on the insulator layer 2. A high work-function electrode 4 and a low work-function electrode 5 are respectively formed at the two ends of the CNT 3. For the stability of the device, an additional insulator layer (not shown in FIG. 1) can be formed on the whole device the CNT 3, the high work-function electrode 4 and the low work-function electrode 5. The conductive substrate 1 can be formed by a doped silicon material such as $N^+Si$. The insulator layer 2 can include a dielectric material such as $SiO_2$. Materials suitable for the high work-function electrode include Palladium. Materials suitable for the low work-function electrode include scandium (Sc) or yttrium (Y).

The CNT 3 provides a conductive channel between the high work-function electrode 4 and the low work-function electrode 5. The high work-function electrode has a work function is higher than the conduction band of the CNT whereas the low high work-function electrode has a work function is lower than the conduction band of the CNT. The high work-function electrode is in contact with the valence band of the CNT without a potential barrier so that holes flow into the CNT's valence band efficiently. The low work-function electrode is in contact with the conductance band of the CNT without barrier so that electrons can flow into the CNT's conduction band efficiently.

Figure 2:
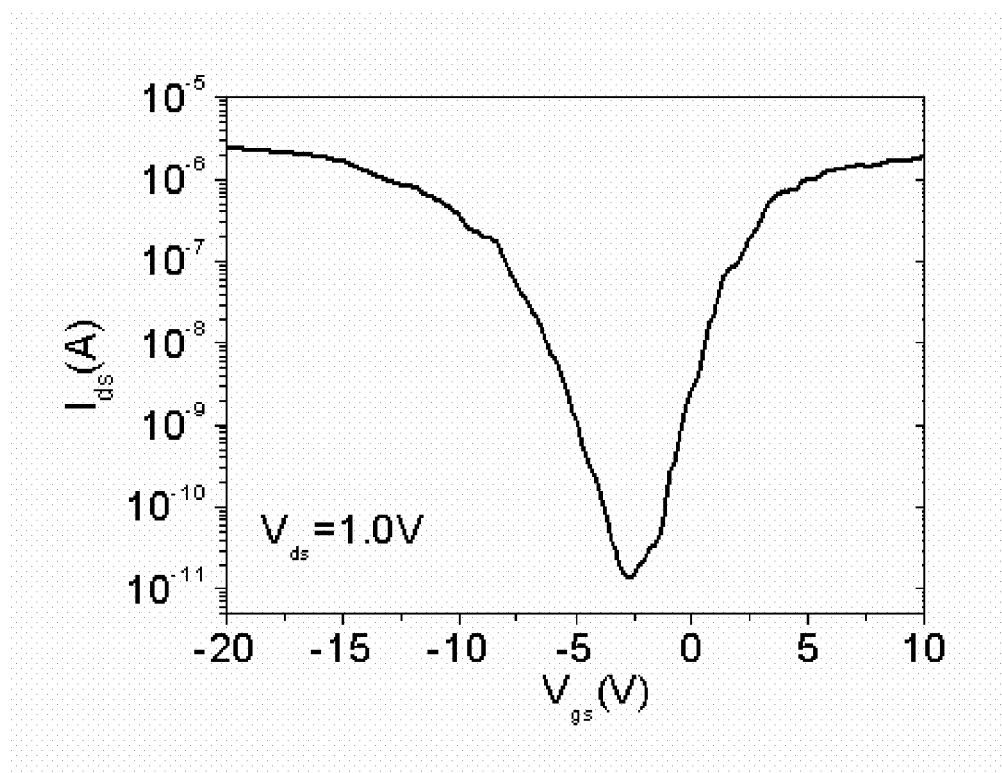
FIG. 2 shows an exemplified I-V performance curve for the CNT-based photoelectric device in FIG. 1, exhibiting the properties of an ambipolar field-effect transistor (FET).

The conductive substrate 1 serves as a gate electrode. Since the gate electrode is below the CNT 3, the photoelectric device 100 can be referred to as a back-gate CNT transistor. The high work-function electrode 4 can serve as a source for the CNT 3 while the low work-function electrode 5 serves as a drain for the CNT 3. In some implementations, the high work-function electrode 4 can be grounded. The voltage $V_{ds}$ of the low work-function electrode 5 can be held at $V_{DD}$. For example, $V_{ds}=V_{DD}=1.0V$. When the gate electrode (i.e. the conductive substrate 1) is held at a positive voltage, electrons can freely flow into conductance band of the CNT 3 by from the low work-function electrode 5, showing n-type transistor characteristics. When the gate electrode is at a negative voltage, holes can flow into the valence band of the CNT 3 from the high work-function electrode 4, showing p-type transistor characteristics. Under these conditions, the photoelectric device 100, as shown in FIG. 2, functions as an ambipolar field-effect transistor (FET).

In some implementations, the low work-function electrode 5 is grounded and the high work-function electrode 4 is biased. The corresponding I-V curve in FIG. 3 shows a conduction curve of a unidirectional diode. The relevant mechanisms are shown in FIGS. 4A and 4B. Under a positive bias, as shown in FIG. 4A, electrons flows into the conductance band of the CNT 3 from the low work-function electrode 5 (Sc in FIG. 4A) and holes flow into the valence band of the CNT 3 from the high work-function electrode 4 (Pd in FIG. 4A) without the inhibition of barriers, leading to a high forward current. Under a negative bias, as shown in FIG. 4B, electrons and holes are prevented by barriers between the Pd and CNT 3 and between the Sc and the CNT 3 from flowing into the CNT 3. The CNT 3 is not conductive. Under these conditions, the photoelectric device 100 functions as a barrier-free bipolar diode (BFBD).

Under positive bias, referring to FIG. 5, electrons in conductance band and holes in valence band can interact with each other to lead electron-hole recombinations. As a result, a photon is emitted in infrared band. In the CNT 3, the effective length for electron-hole recombinations is about 1 micron. When the conductive channel of the CNT 3 is much longer than 1 micron, most of the electrons and holes flown into CNT can recombine and produce photon emission. The photoelectric device 100 can perform as a high efficient light-emitting diode (LEBFBD).

Figure 6:
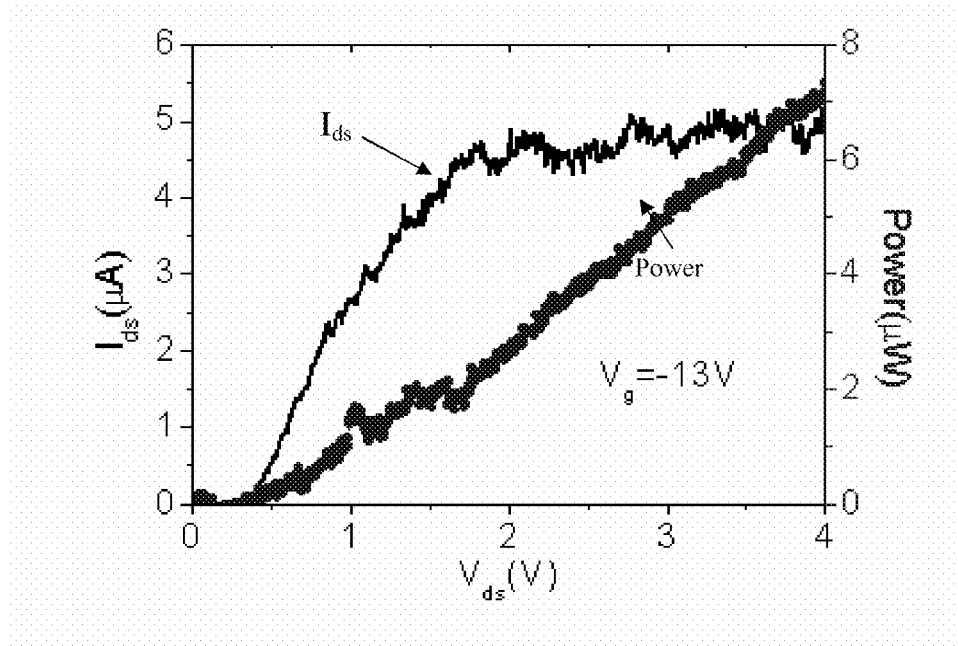
FIG. 6 illustrates an exemplified I-V curve and an exemplified voltage-power curve of the CNT-based photoelectric device under the conditions shown FIG. 5.

FIG. 6 shows I-V and V-Power curves measured when the photoelectric device 100 is conditioned to perform as a LEBFBD. The back gate voltage Vg (i.e. the voltage of the conductive substrate 1) is set to −13V. It should be noted that the cutoff wavelength of the photo detector used in the measurement is about 1500 nm whereas the maximal light-emitting wavelength of CNT is at about 2500 nm. The light-emitting power shown in FIG. 6 is only a small fraction of the total light emission power. The actual light-emitting power is approximately an order of magnitude larger than that what's shown in FIG. 6.

Figure 7:
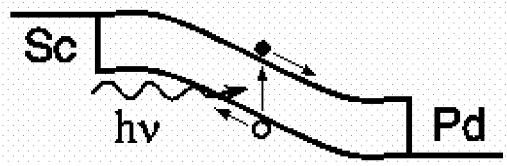
FIG. 7 illustrates the mechanism for the photo detector or photoelectric character performed by the CNT-based photoelectric device of FIG. 1.
Figure 8:
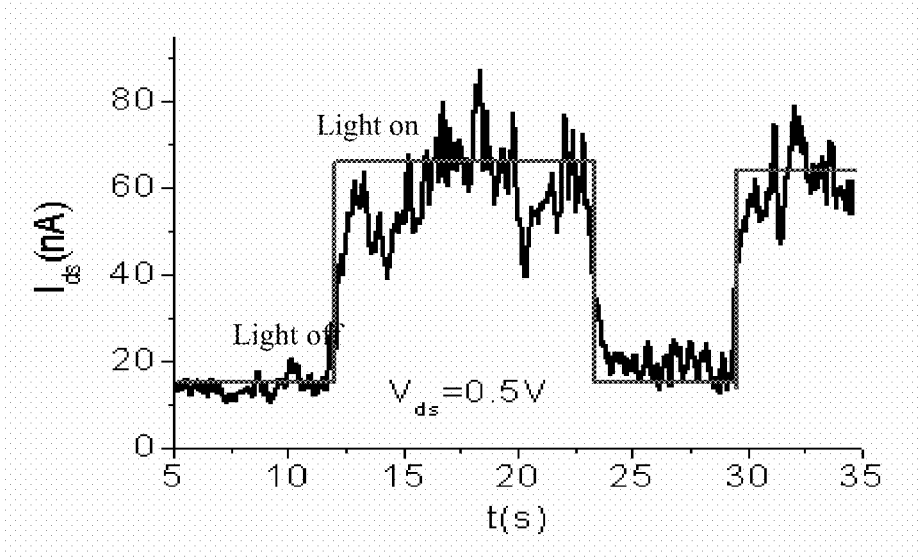
FIG. 8 illustrates the current values during light on and light off in the CNT-based photoelectric device under the condition as shown in FIG. 7.
Figure 9:
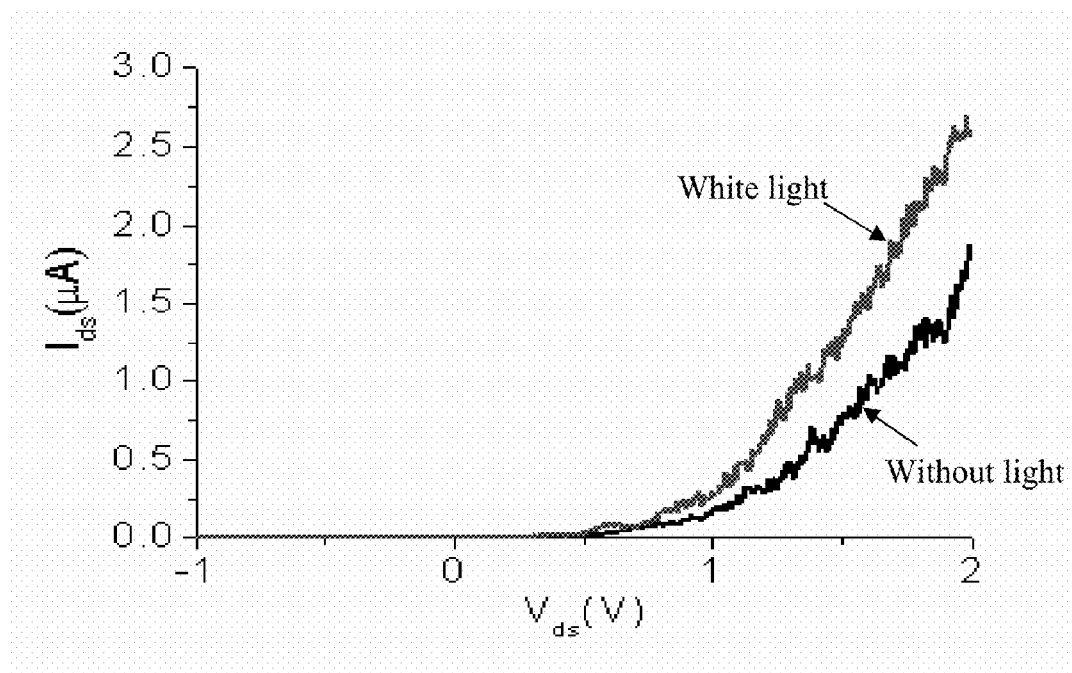
FIG. 9 illustrates exemplified I-V curves of the CNT-based photoelectric device during light on and light off under the condition as shown in FIG. 7.

The barrier-free bipolar diode formed by the photoelectric device 100 can also efficiently convert light energy to electric voltage or current under light illumination. FIG. 7 illustrates the mechanism for the photo detector or photoelectric character performed by the CNT-based photoelectric device 100 under a forward bias. FIG. 8 shows the photo current between light on and light off states when the photoelectric device 100 is under a 0.5V forward bias. FIG. 9 illustrates the impact of light illumination on I-V curve of the barrier-free bipolar diode formed by the CNT-based photoelectric device 100. The current is enhanced significantly under light illumination, which makes it feasible for photo detection.

Figure 10:
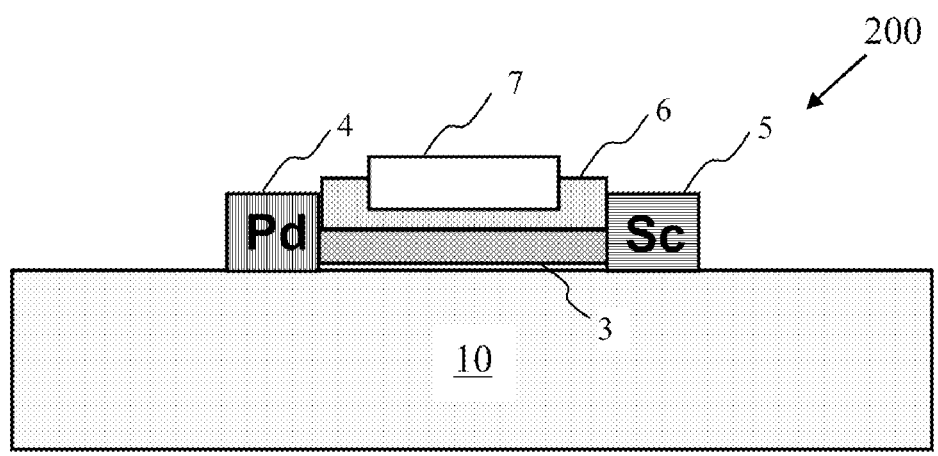
FIG. 10 is a schematic diagram showing the structure of a CNT-based photoelectric device having a top gate.

Although the above discussions are presented using a back-gate CNT-based photoelectric device, similar highly efficient functions can be achieved in a top gate CNT-based device. Referring to FIG. 10, a photoelectric device 200 includes a CNT 3 formed on an insulating substrate 10 (or substrate combining a conductive substrate and an insulator layer as shown in FIG. 1), a high work-function electrode 4 and a low work-function electrode 5 respectively formed at the two ends of the CNT 3, a dielectric layer 6 formed on the CNT 3, and a conductive top-gate layer 7 formed on the dielectric layer 6. The dielectric layer 6 can for example be formed by $HfO_2$ using atomic layer deposition. The top-gate layer 7 can be deposited on the dielectrics layer 6 by photolithography or electron beam lithography.

In summary, the above-disclosed CNT-based photoelectric devices can realize many functions such as ambipolar FET, a barrier-free bipolar diode, light-emitting diode, and photo detector. In some embodiments, the present application discloses a large scale integrated circuit using the above-described photoelectric devices as basic units while providing a range of electric and photoelectric functions.

Figure 11A:
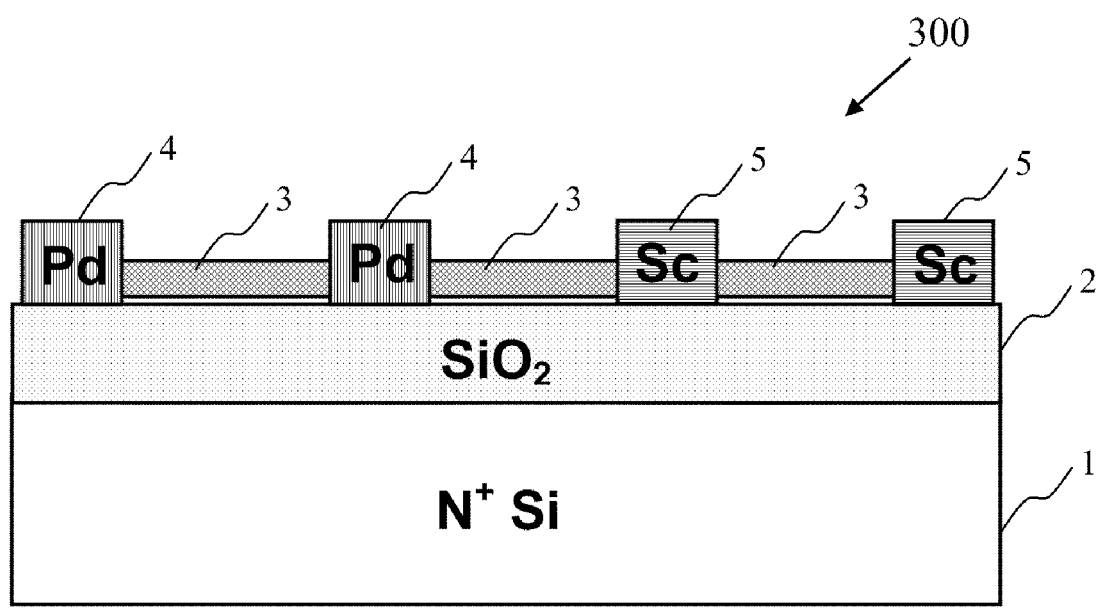
FIG. 11A is a schematic diagram of a CNT-based photoelectric IC unit having a back gate structure.

Referring to FIG. 11A, a back-gate CNT-based circuit unit 300 includes a conductive substrate 1 that serves a back-gate electrode, an insulator layer 2 on the conductive substrate 1, and CNTs 3 formed on introduced on the insulator layer 2. The insulator 2 can include $SiO_2$. High work-function electrodes 4 (e.g. Pd) and low work-function electrodes 5 (e.g. Sc) are formed orderly at the ends of the CNTs 3 on the insulator layer 2. For the stability of the device, another insulator layer (not shown) can be formed on the CNTs 2, the high work-function electrodes 4, and the low work-function electrodes 5. The CNTs can be aligned substantially parallel to the upper surface of the conductive substrate 1. In some embodiments, the CNTs are positioned in a linear array on the conductive substrate 1.

The back-gate electrode (i.e. conductive substrate 1), the high work-function electrodes 4, and the low work-function electrodes 5 can be biased, as previously described, to achieve functions of (1) an n-type FET, (2) a p-type FET, (3) CMOS inverter, (4) an ambipolar FET, (5) an unimpeded bipolar diode, (6) light emitting diode, and (7) a photo detector. Other details of these functions are described s in Chinese Patent Public CN101136408A. A p-type FET can include two high work-function electrodes as source and drain, and a CNT channel between these two electrodes. An n-type FET can include two low work-function electrodes as Source and Drain, and a CNT channel between these two electrodes. These devices also include electronic device (FETs) and photoelectric device (BFBD, LEBFBD).

Figure 11B:
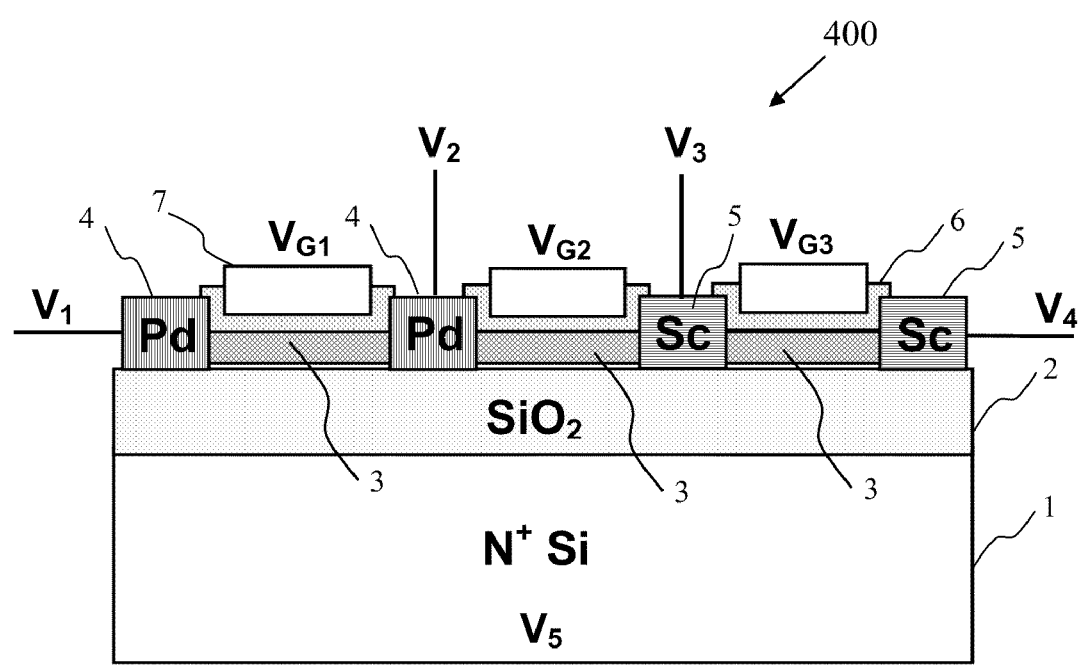
FIG. 11B is a schematic diagram of a CNT-based photoelectric IC unit having a top gate structure.
Figure 12:
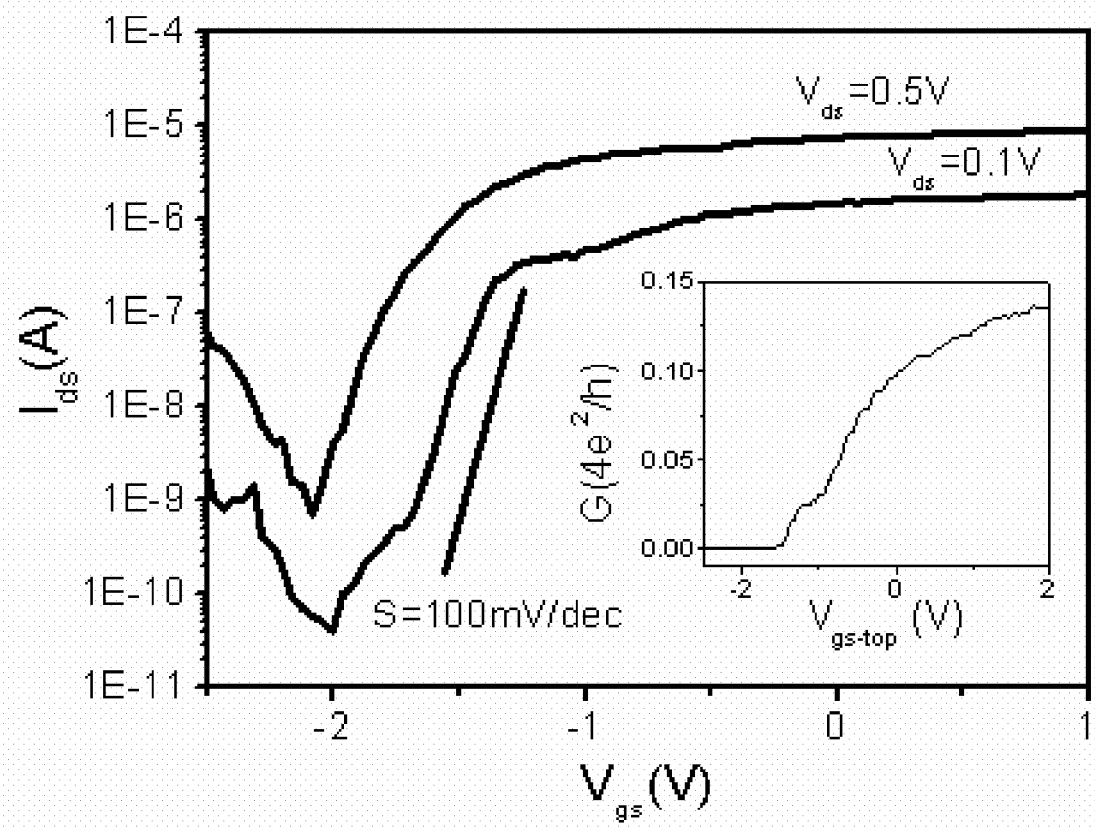
FIGS. 12 and 13 respectively show exemplified field-effect characteristic curves and an I-V curve of the CNT-based photoelectric IC unit in FIG. 11B.
Figure 13:
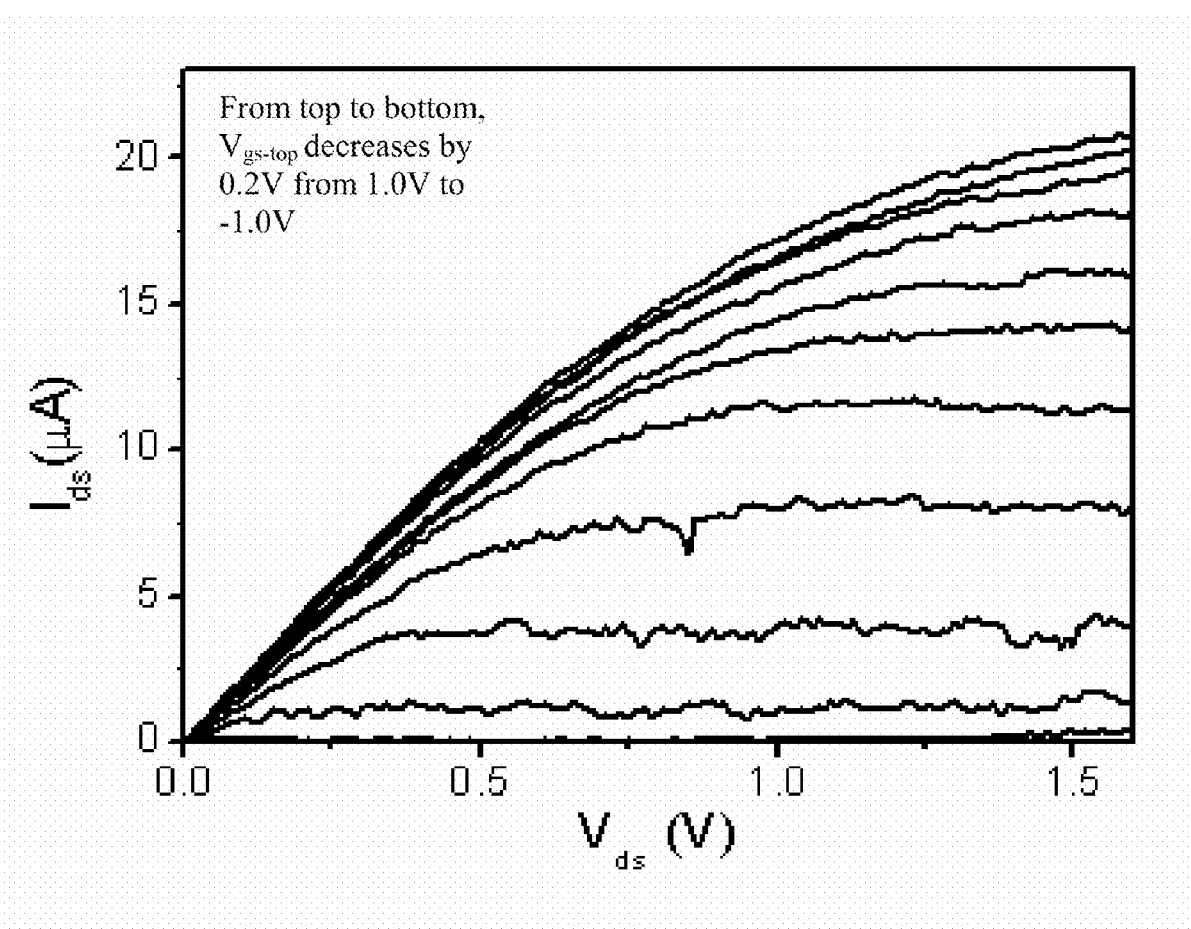

Similarly, referring to FIG. 11B, a top-gate CNT-based circuit unit 400 includes a gate dielectric layer 6 formed on the CNT 3, and optionally portions of the high work-function electrode 4 and the low work-function electrode 5. A gate electrode 7 is formed on the gate dielectric layer 6. When biased as $V_{ds}=V_4$, $V_{gs}=V_{G3}$, $V_5=V_3=0$, the top-gate CNT-based integrated circuit 400 performs as a highly efficient top gate n-type FET device, with its field effect characteristic curves shown in FIG. 12 and I-V curves are shown in FIG. 13. If the bias conditions are changed to $V_{ds}=V_4$, $V_{gs}=V_5$, $V_{G3}=V_3=0$, the top-gate CNT-based integrated circuit 400 performs as a highly efficient back gate n-type device.

The above described back-gate and top-gate CNT-based integrated circuits have simple structures and relatively easy to fabricate. These nano-scale devices can serve as the basic units for nano-electronic circuits and photoelectric integrated circuit. A integrated circuit capable of electric and photoelectric functions can be fabricated by connecting a large number of back-gate CNT-based circuit units or top-gate CNT-based circuit units as described above. Functions of the CNT-based circuit units can be flexibly and customarily set by properly biasing the electrodes.

It should be understood that the described back-gate and top-gate CNT-based integrated circuits may be conditioned to provide electric and photoelectric functions other than the examples provided above. The disclosed CNT-based devices can also be biased using conditions other than the examples described above.

In some embodiments, the present application discloses a CNT-based large scale nano-electric or nano-photoelectric integrated circuit. CNT based large scale IC can be constructed by a combination of the following devices:

A. a device unit consisting of two high work-function electrodes and a CNT providing a conductive channel between the two electrodes;

B. a device unit consisting of two low work-function electrodes and a CNT providing a conductive channel between the two electrodes;

C. a device unit consisting of a high work-function electrode, a low work-function electrode, and a CNT providing a conductive channel between the two electrodes.

Figure 14:
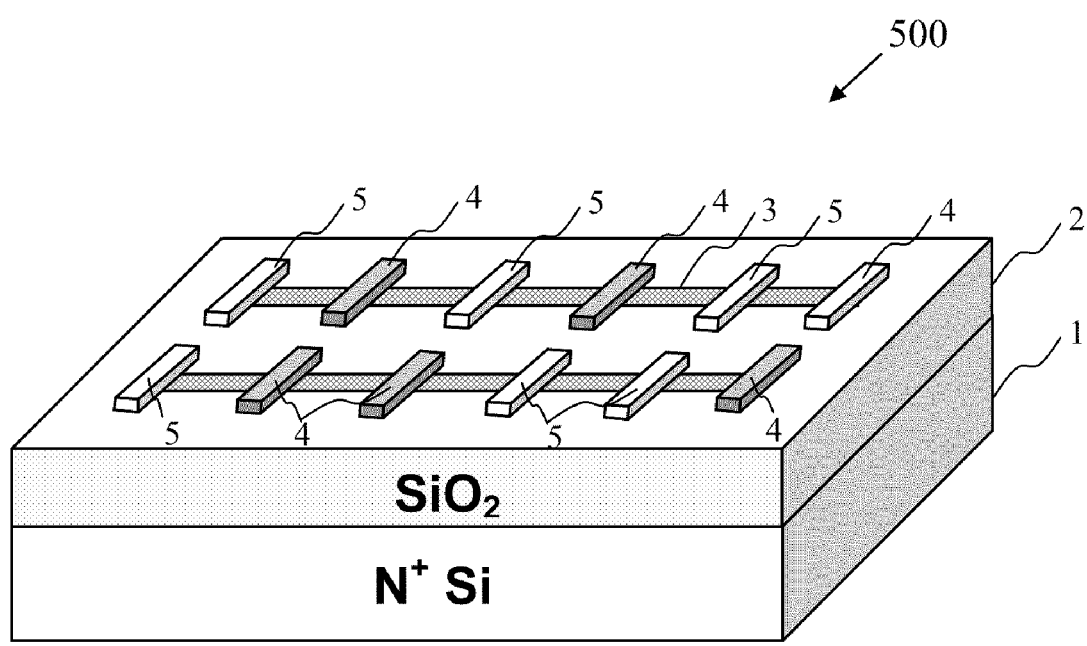
FIG. 14 illustrates the integration a back-gate photoelectric integrated circuit by combining three types of devices.
Figure 15A:
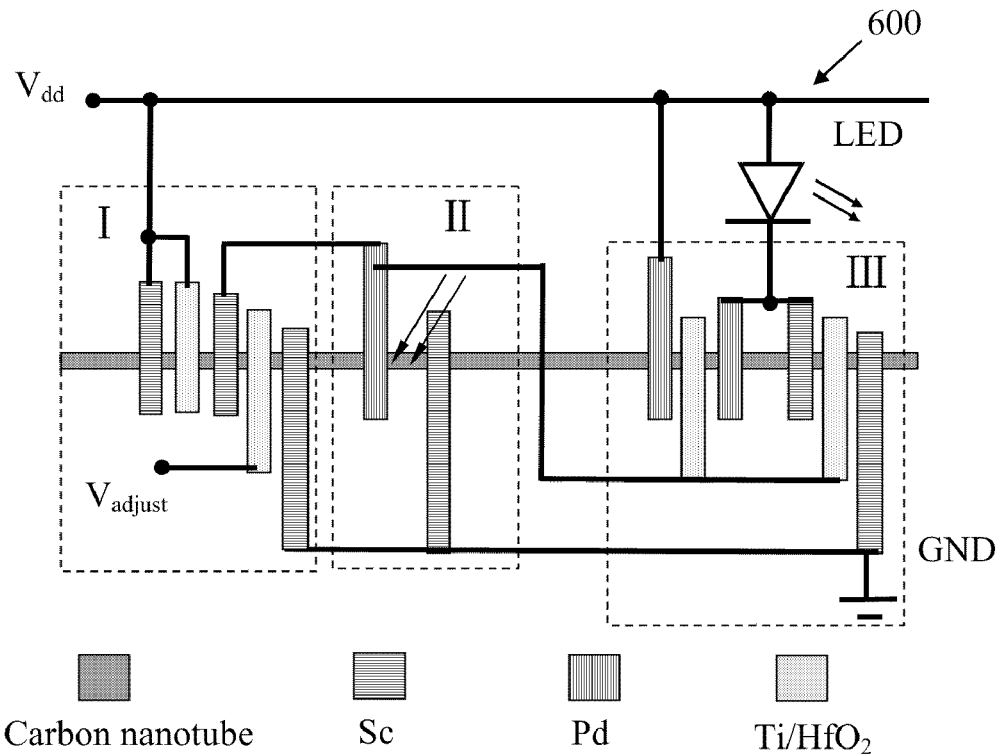
FIG. 15A illustrates the structure of a top-gate photon detecting and light emitting circuit.
Figure 15B:
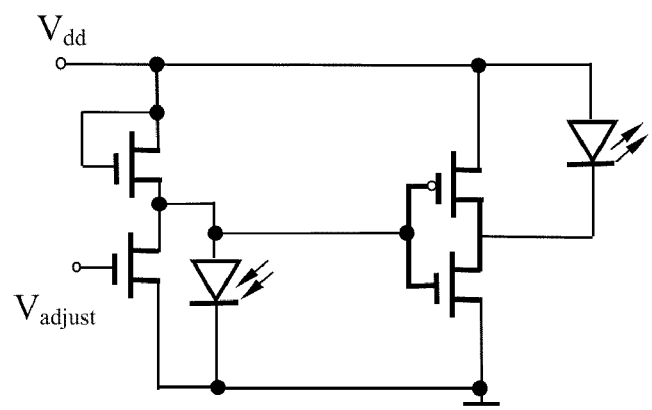
FIG. 15B shows an equivalent circuit diagram of the top-gate photon detecting and light emitting circuit in FIG. 15A.

In the back-gate structure, as shown in FIG. 14, gate electrodes of the CNT-based nano device units are connected with the CNTs via a gate dielectric layer. Sophisticated electric and photoelectric integrated circuits can be realized by connecting the electrodes of the different device units. Electric and photoelectric integrated circuits can also be fabricated by connecting top-gate CNT-based nano device units, as shown in FIGS. 15A and 15B.

Implementation Example 1

The photoelectric device 100 shown in FIG. 1 can be fabricated using the following steps:
1. One or more CNTs are formed on $Si/SiO_2$ substrate by synthesis at predefined locations or by disposing well dispersed CNT solution on $Si/SiO_2$ substrate.
2. Positions of the one or more CNTs are accurately determined by a Scanning Electron Microscope or an Atomic Force Microscope.
3. A photo resist layer or a PMMA coating is formed on the $Si/SiO_2$ substrate. The position the shape of the Pd electrode is provided by photolithography or EBL.
4. After development, the substrate is placed in electron beam evaporation or thermal evaporation system. A Pd layer is deposited in a vacuum environment.
5. Unwanted portion of the Pd layer is removed by lift-off in acetone and wife off.
6. Steps 3-5 are repeated to form the Sc electrode (evaporate a Sc layer in step 4).
7. Biasing the electrodes (Pd, Sc and back gate electrode) as above described to demonstrate the functions such as an ambipolar FET, an unimpeded ambipolar diode, a light emitting diode, and a photo detector.

Implementation Example 2

The top-gate CNT-based circuit unit 400 can be fabricated using the following steps:
1. One or more CNTs are formed on $Si/SiO_2$ substrate by synthesis at predefined locations or by disposing well dispersed CNT solution on $Si/SiO_2$ substrate.
2. Positions of the one or more CNTs are accurately determined by a Scanning Electron Microscope or an Atomic Force Microscope.
3. A photo resist layer or a PMMA coating is formed on the $Si/SiO_2$ substrate. The position the shape of the electrode is provided by photolithography or EBL.
4. A dielectrics layer ($ZrO_2$, $Al_2O_3$ or $HfO_2$) is formed on the sample using ALD.
5. Unwanted portions of the dielectrics layer are removed by lift-off in acetone or wet etching.
6. A photo resist layer is formed or a PMMA layer is coated on the substrate. The shape of position of the Pd electrode is defined by photolithography or EBL.
7. After development, the substrate is placed in electron beam evaporation or thermal evaporation system. A Pd layer is deposited in a vacuum environment.
8. Unwanted portion of the Pd layer is removed by lift-off in acetone and wife off.
9. Steps 6-8 are repeated to form the Sc electrode. In step 6, define Sc electrode shape. In step 7, evaporate a layer of Sc.
10. Repeat steps 6-8 to form the top-gate electrode. In step 6, define top gate electrode shape. In step 7, evaporate a layer of top gate metal.

Implementation Example 3

A CNT-based back-gate photoelectric integrated circuit 500 is shown in FIG. 14. The CNT-based photoelectric integrated circuit 500 includes a conductive substrate 1 (back-gate electrode), a dielectric layer 2, and rows of CNTs 3 formed on the insulator layer 2. High work-function electrodes 4 (Pd) and low work-function electrodes 5 (Sc) are formed in alternative positions along the CNT 3.

Specific fabrication steps are as follows:
1. One or more CNTs are formed on $Si/SiO_2$ substrate by synthesis at predefined locations or by disposing well dispersed CNT solution on $Si/SiO_2$ substrate.
2. Positions of the rows of CNTs are accurately determined by a Scanning Electron Microscope or an Atomic Force Microscope.
3. A photo resist layer or a PMMA coating is formed on the $Si/SiO_2$ substrate. The position the shape of the electrode is provided by photolithography or EBL.
4. After development, the substrate is placed in electron beam evaporation or thermal evaporation system. A Pd layer is deposited in a vacuum environment.
5. Unwanted portion of the Pd layer is removed by lift-off in acetone and wife off.
6. Steps 6-8 are repeated to form the Sc electrode. In step 3, define Sc electrode shape. In step 4 evaporate a layer of Sc.
7. The electrodes are biased to perform the desired functions, as previously described.

Implementation Example 4

A CNT-based top-gate photoelectric integrated circuit 600 is shown in FIGS. 15A and 15B. The CNT-based top-gate photoelectric integrated circuit 500 includes a CNT, several Pd electrodes, and several Sc electrodes on an insulator substrate. A dielectric layer is deposited on the CNT using ALD. A top-gate electrode is deposited on the dielectric layer (Ti/$HfO_2$). Specific fabrication steps are as follows:
1. One or more CNTs are formed on $Si/SiO_2$ substrate by synthesis at predefined locations or by disposing well dispersed CNT solution on $Si/SiO_2$ substrate.
2. Positions of the one or more CNTs are accurately determined by a Scanning Electron Microscope or an Atomic Force Microscope.
3. A photo resist layer or a PMMA coating is formed on the $Si/SiO_2$ substrate. The position the shape of the electrode is provided by photolithography or EBL.
4. After development, the substrate is placed in electron beam evaporation or thermal evaporation system. A Pd layer is deposited in a vacuum environment.

5. Unwanted portion of the Pd layer is removed by lift-off in acetone and wife off.
6. Steps 3-5 are repeated to form the Sc electrode (evaporate a Sc layer in step 4).
7. Repeat 3-5 steps. In step 3, define positions and shapes of top-gate electrodes. In step 4, form a dielectrics layer by ALD and followed by formation of a metal layer Ti by evaporation.
8. Connecting the circuit as shown in FIG. 15A and bias voltages of the electrodes.

In the CNT-based top-gate photoelectric integrated circuit 600, shown in FIG. 15A, Section I includes a voltage regulation circuit. Section II includes a photoelectric detection circuit. Section III includes signal processing circuit. Section I regulates or rectifies the input voltage to provide operation voltage supply to Section II. Under light illumination, Section II can generate a photo voltage for Section III to drive a light emitting diode to emit light. As described, the CNT-based top-gate photoelectric integrated circuit 600 can detect photons and emit light in similar functions as its equivalent circuit as shown in FIG. 15B.

Other details of CNT-based nano-electric or nano-photoelectric devices are disclosed by co-inventor Xuelei Liang et al at Peking University (Chinese Patent Application 200710090362.4), which reported fabrication of CT-based n-type field-effect transistors using Scandium electrodes and near theoretical limit performance in these devices. Additionally, co-inventor Lianmao Peng et al at Peking University proposed a nano material based CMOS circuit and its fabrication method based on the work of Liang et al (Chinese Patent Publication CN101136408A and Chinese Patent Application 200710121804.7). It is proposed that CNT based CMOS circuit is fabricated by using different contact metal electrodes to control the polarity of the CNT-based field effect transistors. The disclosure of these related patent applications are incorporated herein by reference.

What is claimed is:

1. A carbon nano-tube based photoelectric integrated circuit, comprising:
   a substrate;
   a first high work-function electrode having a first work function and over the substrate;
   a second high work-function electrode having a second work function and over the substrate;
   a first low work-function electrode having a third work function and over the substrate;
   a second low work-function electrode having a fourth work function and over the substrate;
   a first carbon nanotube (CNT) over the substrate, wherein the first CNT forms a conductive channel between the first high work-function electrode and the second high work-function electrode;
   a second CNT over the substrate, wherein the second CNT forms a conductive channel between the second high work-function electrode and the first low work-function electrode;
   a third CNT over the substrate, wherein the third CNT forms a conductive channel between the first low work-function electrode and the second low work-function electrode, wherein the first work function and the second work function are higher than a work function of at least one of the first CNT, the second CNT, or the third CNT, wherein the third work function and the fourth work function are lower than a work function of at least one of the first CNT, the second CNT, or the third CNT;
   a dielectric material formed on the first CNT, the second CNT and the third CNT; and
   a conductive material in contact with the dielectric material.

2. The carbon nano-tube based photoelectric integrated circuit of claim 1, wherein the conductive material comprises three conduction portions respectively formed the dielectric material.

3. The carbon nano-tube based photoelectric integrated circuit of claim 1, wherein the first CNT, the second CNT, and the third CNT are substantially parallel to a surface of the substrate.

4. The carbon nano-tube based photoelectric integrated circuit of claim 1, wherein the first high work-function electrode and the second high work-function electrode comprise Palladium.

5. The carbon nano-tube based photoelectric integrated circuit of claim 1, wherein the first low work-function electrode and the second low work-function electrode comprise Scandium or Yttrium.

6. The carbon nano-tube based photoelectric integrated circuit of claim 1, wherein the first CNT, the second CNT, and the third CNT are positioned substantially in a linear array.

7. The carbon nano-tube based photoelectric integrated circuit of claim 1, wherein the dielectric material includes an oxide, wherein the conductive material includes a doped silicon material or a metal.

8. The carbon nano-tube based photoelectric integrated circuit of claim 1, wherein the first work function and the second work function are higher than work functions of the first CNT and the second CNT, wherein the third work function and the fourth work function are lower than work functions of the second CNT and the third CNT.

9. The carbon nano-tube based photoelectric integrated circuit of claim 1, wherein the dielectric material is in contact with the first high work-function electrode, the second high work-function electrode, the first low work-function electrode, and the second low work-function electrode.

10. The carbon nano-tube based photoelectric integrated circuit of claim 9, wherein the conductive material is insulated by the dielectric material from the first high work-function electrode, the second high work-function electrode, the first low work-function electrode, and the second low work-function electrode.

11. The carbon nano-tube based photoelectric integrated circuit of claim 1, wherein the substrate comprises:
    a conductive portion; and
    an insulator layer formed on the conductive portion.

12. The carbon nano-tube based photoelectric integrated circuit of claim 11, wherein the insulator layer comprises silicon oxide, and wherein the conductive portion comprises doped silicon.

* * * * *